(12) United States Patent
Masuko et al.

(10) Patent No.: US 7,304,417 B2
(45) Date of Patent: Dec. 4, 2007

(54) PACKAGE FOR ELECTRONIC DEVICE, BASE SUBSTRATE, ELECTRONIC DEVICE AND FABRICATION METHOD THEREOF

(75) Inventors: Shingo Masuko, Suzaka (JP); Osamu Kawachi, Yokohama (JP); Takumi Kooriike, Suzaka (JP)

(73) Assignee: Fujitsu Media Devices Limited, Yokohama (JP)

( * ) Notice: Subject to any disclaimer, the term of this patent is extended or adjusted under 35 U.S.C. 154(b) by 309 days.

(21) Appl. No.: 10/795,444

(22) Filed: Mar. 9, 2004

(65) Prior Publication Data

US 2004/0226741 A1 Nov. 18, 2004

(30) Foreign Application Priority Data

Mar. 10, 2003 (JP) ............................. 2003-064227
Apr. 25, 2003 (JP) ............................. 2003-121562

(51) Int. Cl.
*H01L 41/08* (2006.01)
(52) U.S. Cl. ....................................... 310/344; 310/348

(58) Field of Classification Search ................ 310/344, 310/348
See application file for complete search history.

(56) References Cited

U.S. PATENT DOCUMENTS

| 5,430,345 A | * | 7/1995 | Takahashi | ................... 310/348 |
| 5,500,628 A | * | 3/1996 | Knecht | ........................ 331/68 |
| 5,506,463 A | * | 4/1996 | Yoshimoto et al. | ......... 310/344 |

FOREIGN PATENT DOCUMENTS

| JP | 2-222562 A | 9/1990 |
| JP | 11-122072 | 4/1999 |
| JP | 2001-53577 | 2/2001 |
| JP | 2002-016163 A | 1/2002 |
| JP | 2003-037208 A | 2/2003 |

* cited by examiner

*Primary Examiner*—Mark Budd
(74) *Attorney, Agent, or Firm*—Arent Fox LLP

(57) ABSTRACT

A package for an electronic device includes a cavity that houses an electronic element, and grooves or holes formed on or in sidewalls that define the cavity. The grooves or holes extend from an open side of the cavity so as not to reach a bottom side of the package.

13 Claims, 11 Drawing Sheets

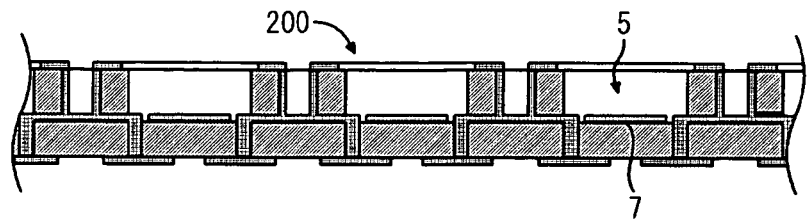
Fig. 5A
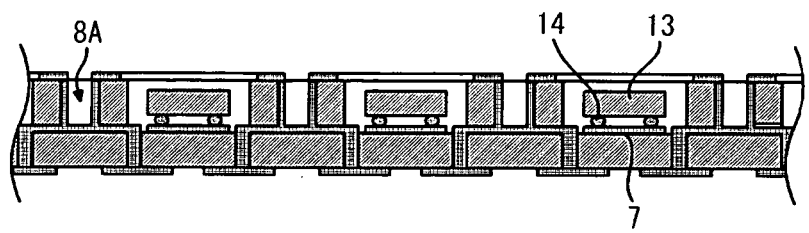
Fig. 5B
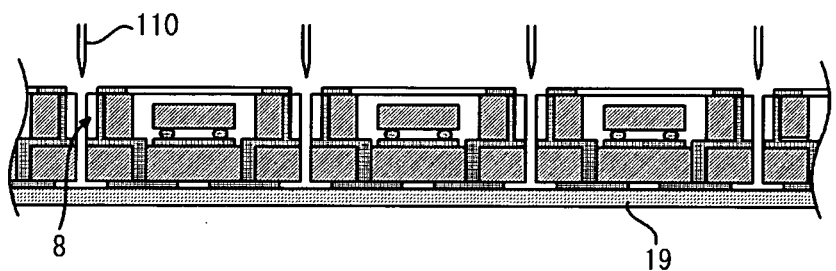
Fig. 5C
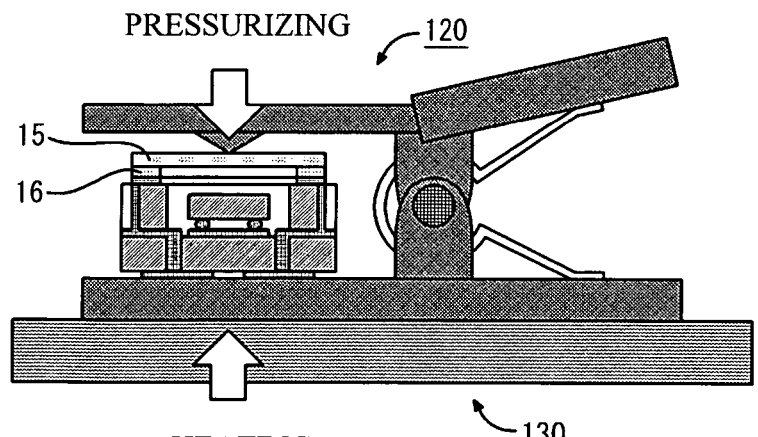
Fig. 5D
Fig. 5E
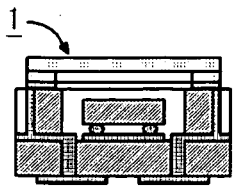

PACKAGE FOR ELECTRONIC DEVICE, BASE SUBSTRATE, ELECTRONIC DEVICE AND FABRICATION METHOD THEREOF

BACKGROUND OF THE INVENTION

1. Field of the Invention

The invention generally relates to a package for an electronic device, a base substrate, an electronic device, and a fabrication method thereof.

2. Description of the Related Art

Recently, there has been a demand to downsize electronic elements mounted to electronic devices and improve the performance thereof with downsizing and high performance of the electronic devices. For instance, there have been similar demands on surface acoustic wave (SAW) devices that are electronic parts used as filters, delay lines, oscillators in electronic devices capable of transmitting and receiving radio waves.

Generally, SAW devices have a SAW filter chip that is flip-chip mounted within a cavity having a bottom surface on which interconnection lines are formed. An interdigital transducer (IDT) having comb-like electrodes is formed on a piezoelectric substrate of the SAW filter chip. This type of SAW devices is disclosed in Japanese Laid-Open Patent Application Publication 2001-53577, particularly, FIG. 3. In the SAW device of the above-mentioned type, an input electric signal applied to the IDT located on the input side of the device is transformed to a SAW, which is then propagated on the piezoelectric substrate. A filtered electric signal is available via the IDT located on the output side.

A cavity that houses the SAW filter chip is required to be hermetically sealed in order to reduce loss of the SAW that is propagated on the piezoelectric substrate. There is a method for sealing the cavity shown in FIG. 1. A washer 116 of solder made of gold-tin alloy is provided on sidewalls that define cavity. The washer 116 serves as a bonding material. The washer 116 is then heated and pressurized, so that a lid or cap 115 placed on the washer 116 can be fixed to the sidewalls.

The lid 115 may be made of an electrically conductive material in order to reduce external electromagnetic noise. In that case, it is required that the lid 115 is set at the ground potential to prevent degradation of performance of the filter. This requirement may be achieved in the conventional method shown in FIG. 1. More particularly, castellations 108 are provided at the four corners of the package 102 so as to reach the backsurface of the package 102. A conductor is provided on the castellations 108, via which the lid 115 coupled to a pattern 109 on the top of the package 102 can be electrically connected to a ground pattern formed on a circuit board provided at the bottom side of the package 102.

However, the above conventional method has the following disadvantage. That is, melted washer 116 flows out through the castellations 108, and may short-circuit a wiring pattern (foot pattern) formed on the backside of the package 102 or a wiring pattern formed on a die attach surface that corresponds to the bottom surface 106 of the cavity 105. Thus, the step of fixing the lid 115 is extremely sensitive.

SUMMARY OF THE INVENTION

It is a general object of the present invention to provide an electronic device that can be simply fabricated and to provide a fabrication method thereof.

A further object of the present invention is to provide a package for such an electronic device and a base substrate.

The above objects of the present invention are achieved by a package for an electronic device comprising: a cavity that houses an electronic element; and grooves or holes formed on or in sidewalls that define the cavity, the grooves or holes extending from an open side of the cavity so as not to reach a bottom side of the package.

The above objects of the present invention are also achieved by a base substrate comprising packages that are integrally arranged two-dimensionally; each of the packages includes: a cavity that houses an electronic element; and grooves or holes formed on or in sidewalls that define the cavity, the grooves or holes extending from an open side of the cavity so as not to reach a bottom side of the package.

The above objects of the present invention are also achieved by an electronic device comprising: an electronic element; a package that houses the electronic element; and a lid attached to the package, the package comprising: a cavity that houses the electronic element; and grooves or holes formed on or in sidewalls that define the cavity, the grooves or holes extending from an open side of the cavity so as not to reach a bottom side of the package. The above objects of the present invention are also achieved by a method of fabricating electronic devices comprising the steps of: a) mounting electronic elements in cavities arranged in a base substrate two-dimensionally, the base substrate having holes arranged in the peripheries of the cavities so as not to penetrate the base substrate; b) dividing the base substrate into parts each having a respective one of the cavities; and c) bonding a lid to each of the parts so as to seal each of the cavities by an electrically conductive material.

BRIEF DESCRIPTION OF THE DRAWINGS

Other objects, features and advantages of the present invention will become apparent from the following detailed description when read in conjunction with the accompanying drawings, in which:

FIGS. 5A through 5E show a fabrication process of the SAW device subsequent to the process shown in FIG. 4 according to the first embodiment of the present invention;

FIGS. 10A through 10D show a fabrication process of a package according to the second embodiment of the present invention in which FIG. 10D shows cross-sectional views taken along lines G–G', H–H' and I–I' shown in FIGS. 10A, 10B and 10C, respectively;

DESCRIPTION OF THE PREFERRED EMBODIMENTS

A description will now be given of embodiments of the present invention with reference to the accompanying drawings.

First Embodiment

A first embodiment of the present invention is directed to a SAW device.

Figure 1:
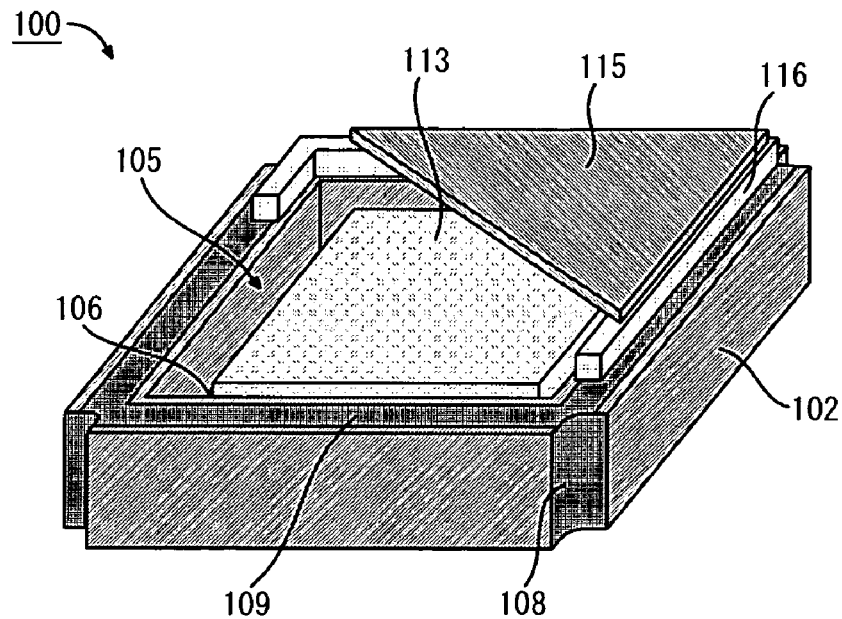
FIG. 1 is a perspective view of a conventional SAW device.
Figure 2:
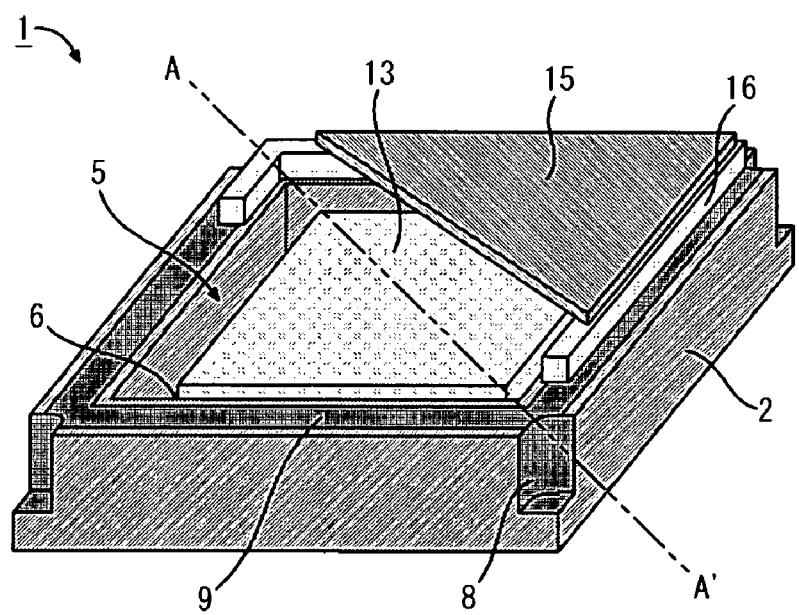
FIG. 2 is a perspective view of a SAW device according to a first embodiment of the present invention.

FIG. 2 is a perspective view of a SAW device 1 according to the present embodiment. The SAW device 1 has a SAW chip 13 having a piezoelectric substrate on which an interdigital transducer (IDT) having comb-like electrodes is formed. The SAW chip 13 is housed in a cavity 5 of a package 2. A wiring pattern (die attach pattern 7, see FIG. 3) is formed on the bottom surface of the cavity 5 (die attach surface 6). The die attach pattern 7 has the major component of aluminum, copper, gold, molybdenum, tungsten, tantalum, chromium, titanium, platinum, ruthenium or rhodium. The SAW chip 13 is flip-chip mounted so that the IDTs face the bottom of the cavity (face-down mounting). The die attach pattern 7 and the SAW chip 13 are bonded together with bumps 14 (see FIG. 3), which is made of a conductive material of, for example, gold, aluminum or cupper as the major component, so that these parts are electrically connected and mechanically fixed. The package 2 may be a multilayered substrate formed by laminated substrates, which may contain ceramics (including aluminum-ceramics) as the major component, for example. Alternatively, the package 2 may be made of a high polymer material such as BT (Bismuthimido-Triazine) resin, PPE (Polyphenylene-Ethel) or polyimide resin, or a complex high polymer material including glass-epoxy, glass-cloth or the like.

Four castellations 8 are formed at respective corners of the package 2. Each of the castellations 8 does not reach the back surface of the package 2. The back surface of the package 8 is opposite to the side on which the lid 15 is located. In the following, the above back surface is also referred to as bottom surface. The castellations 8 are grooves that have a cross-sectional shape that corresponds to, for example, a quarter of a circle. The surfaces of the grooves are plated with a conductive material that contains, for example, aluminum, copper, gold, molybdenum, tungsten, tantalum, chromium, titanium, platinum, ruthenium or rhodium as the major component. Conductive layers 10 thus formed by plating are electrically connected to a conductive upper layer 9 formed on the package 2 by plating. The upper plating layer 9 is also made of, for example, aluminum, copper, gold, molybdenum, tungsten, tantalum, chromium, titanium, platinum, ruthenium or rhodium as the major component. The upper layer 9 is formed around the periphery of the opening of the cavity 5. A washer 16, which may be made of, for example, solder, gold or tin as the major component, is laminated on the upper plating layer 9. A lid 15, which is formed by an iron plate for an example, is fixed to the top of the package 2 via the washer 16. The lid 15 is electrically connected with the castellation plating layers 10 via the washer 16 and the upper plating layer 9.

Figure 3:
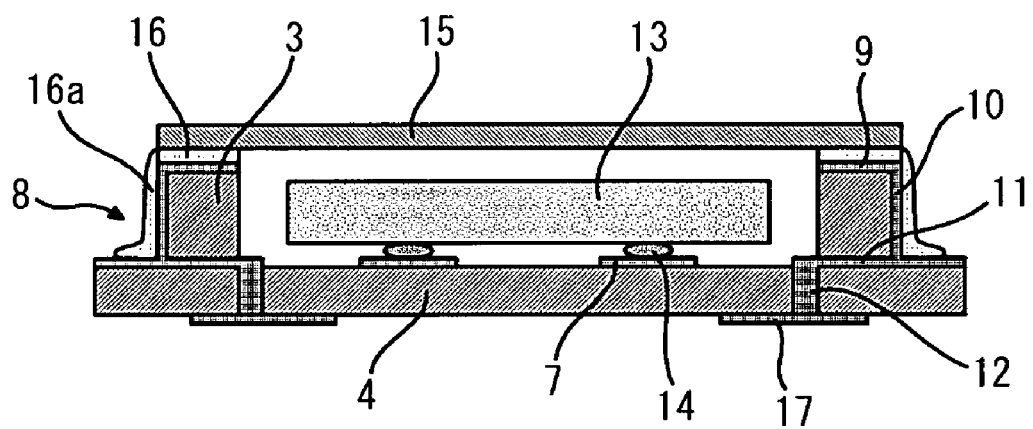
FIG. 3 is a cross-sectional view taken along a line A–A' shown in FIG. 2.

FIG. 3 is a cross-sectional view of the SAW device 1 taken along a line A–A' shown in FIG. 2. As shown in FIG. 3, the package 2 includes a lower substrate 4 and an upper substrate 3. The SAW chip 13 is facedown-mounted on the lower substrate 4, which has the die attach pattern 7 for facedown bonding. The upper substrate 3 surrounds the SAW chip 13, and forms the cavity 5 together with the lower substrate 4.

The castellations 8 are formed only on the upper substrate 3. Therefore, steps defined by the lower substrate 4 are provided at the lower sides of the castellations 8. The steps thus formed function to retain a portion 16a of the washer 16 that flows out due to pressurization and/or heating during bonding. In other words, the castellations 8 function as liquid sumps, so that the washer portion 16a that flows out can be prevented from short-circuiting a foot pattern 17 on the back surface of the package 2.

The castellation plating layers 10 are electrically connected with a wiring pattern 11 formed on the lower substrate 4. The wiring pattern 11 is also electrically connected with the foot pattern 17 formed on the bottom surface of the lower substrate 4 through via-wires 12 penetrating therethrough. The foot pattern 17 is a ground pattern and sets the lid 15 at the ground potential, so that the SAW device 1 can be prevented from being degraded due to a capacitor defined by the conductive lid 15 and the wiring pattern 11, the foot pattern 17 or the like. On backside of the lower substrate 4, that is, the bottom of the package 2, provided is a foot pattern that serves as external terminals for inputting electric signals to the IDT of the SAW chip 13.

The above-mentioned package 2 can be fabricated by bonding the lower substrate 4 and the upper substrate 3. The lower substrate 4 may be formed by laminating a plurality of thin substrates. Similarly, the upper substrate 3 may be formed by laminating a plurality of thin substrates. A fabrication method for the package 2 will now be explained by referring to FIGS. 4A through 4C.

Figure 4C:
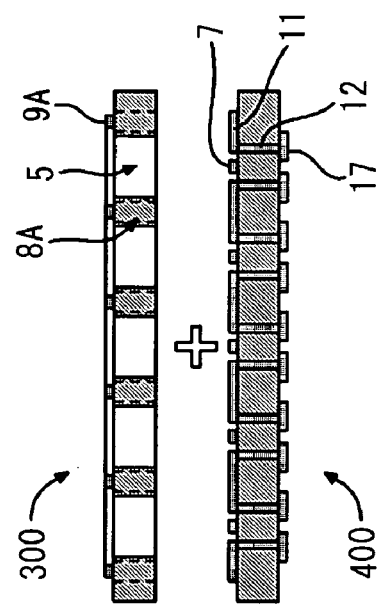
FIGS. 4A through 4C show a fabrication process of a package according to the first embodiment of the present invention.
Figure 4A:
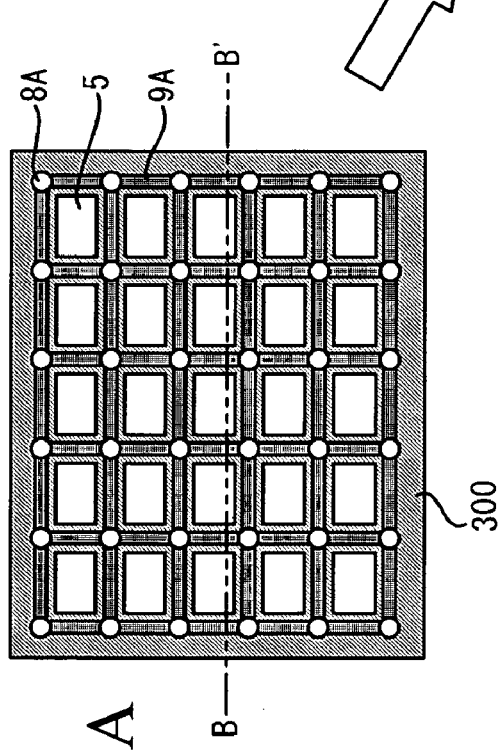

FIG. 4A is a plan view of a substrate 300 that has a multi-gathering structure in which multiple upper substrates 3 are arranged in rows and columns. As shown in FIG. 4A, a plurality of cavities 5 are arranged two-dimensionally on the substrate 300, and through-holes 8A having a circular cross section are formed at positions located between diagonal pairs of cavities 5. The through-holes 8A are castellations 8 before dividing. The through-holes 8A are formed so as to penetrate the substrate 300, and the inner walls thereof are plated. This plating forms the castellation plating layers 10 before dividing. A plating layer 9A having a given pattern is further formed on the upper surface of the substrate 300. The plating layer 9A forms the upper plating layer 9[A] before dividing.

Figure 4B:
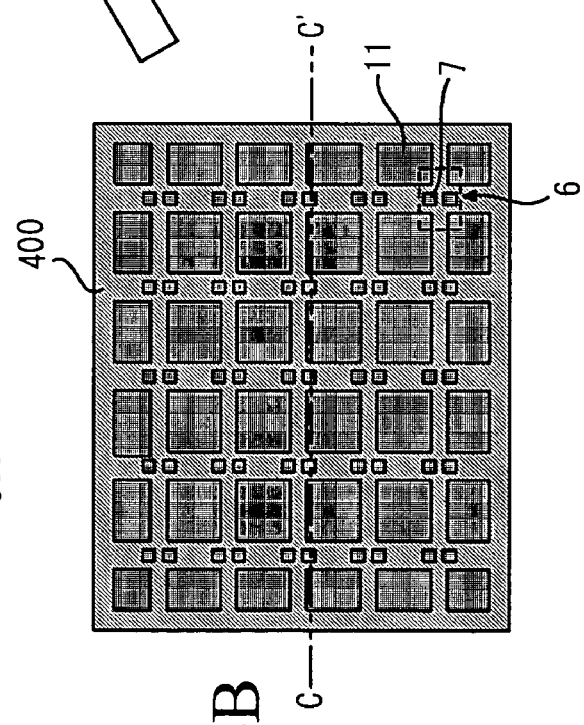

FIG. 4B is a plan view of a substrate 400 that has a multi-gathering structure in which multiple lower substrates 3 are arranged in rows and columns. As shown in FIG. 4B, the die attach pattern 7 is formed in regions corresponding to the cavities 5 on the substrate 300, in other words, in regions corresponding to the die attach surfaces 6 of the packages 2. Further, the wiring pattern 11 is formed in regions that correspond to the through-holes 8A and are wider than the through-holes 8A. The via-wiring interconnections 12 and the foot pattern 17 are also formed in and on the lower substrate 400 (see FIG. 4C and FIG. 3) beforehand.

The substrates 300 and 400 are bonded as shown in FIG. 4C, so that a base substrate 200 shown in FIG. 5A can be produced. The base substrate 200 has multiple packages 2, which are arranged two-dimensionally in integral fashion.

A description will now be given, with reference to FIGS. 5A through 5E, of a method of fabricating SAW devices 1 with the above-mentioned base substrate 200. FIGS. 5A through 5E are respectively cross-sectional views that correspond to the cross-sectional view taken along the line A–A' shown in FIG. 2.

FIG. 5A is a cross-sectional view of the base substrate 200 fabricated as mentioned above. As shown in FIG. 5B, SAW chips 13 are flip-chip mounted in the cavities 5 of the base substrate 200 by using bumps 14. After the SAW chips 13 are mounted, a dicing tape 19 is adhered to the bottom surface of the base substrate 200, which is then divided into individual packages 2 by using a dicing blade 110, a laser beam or the like, as shown in FIG. 5C.

Thereafter, the washer 16 is formed on each individual package 2, and the lid 15 is placed on the washer 16. Then, the lid 15 is bonded to the package 2 by dissolving the washer 16 while the package 2 is pressurized and heated by a pressurization means 120 and a heating means 130, respectively, as shown in FIG. 5D, so that the SAW device 1 shown in FIG. 5E can be fabricated. During the above-mentioned process, the dissolved and flowed-out washer 16a does not reach the back surface of the package 2 since the washer 16a is retained in the castellations 8. Thereby, the foot pattern 17 formed on the back surface of the package 2 can be prevented from being short-circuited.

Although the four castellations 8 that do not reach the bottom of the package 2 are arranged at the four corners thereof in the above-mentioned embodiment, the castellations 8 may be formed at any positions on the outer surfaces of the sidewalls of the package 2. In this case, the castellations 8 should reach the top of the package 2.

Second Embodiment

A description will now be given of a second embodiment of the present invention with reference to the accompanying drawings.

In the above-mentioned first embodiment, the castellations 8 are formed on the outer surfaces of the sidewalls of the package 2. In contrast, the second embodiment employs an arrangement shown in FIG. 6 in which castellations 28a and 28b are formed on the inner surfaces of the sidewalls of a package 22, namely, the inner walls of the cavity 5.

Figure 6:
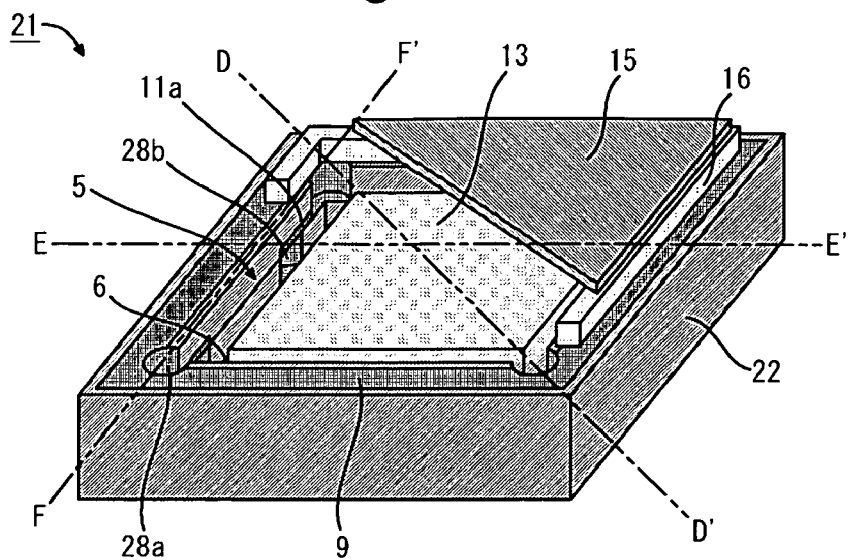
FIG. 6 is a perspective view of a SAW device according to a second embodiment of the present invention.

FIG. 6 shows a SAW 21 of the present embodiment. As shown in FIG. 6, castellations 28a and 28b that have a two-stage structure are formed on the inner walls of the cavity 5, and have plating layers 10a and 10b formed on the surfaces thereof, respectively. The plating layers 10a and 10b (see FIGS. 7 and 8) are electrically connected each other via a wiring pattern 11a. This configuration will be explained below in more detail with reference to FIGS. 7 through 9.

Figure 7:
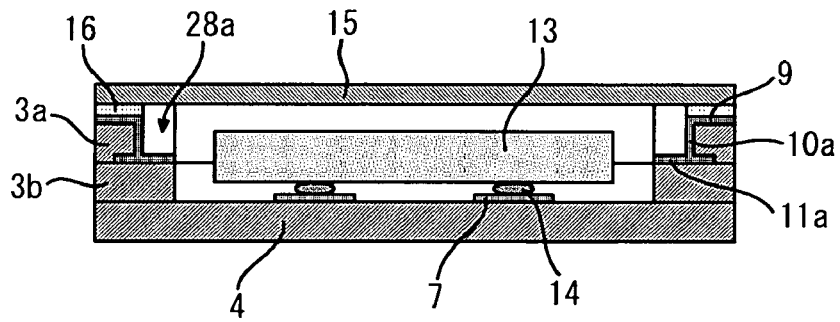
FIG. 7 is a cross-sectional view taken along a line D–D' shown in FIG. 6.
Figure 8:
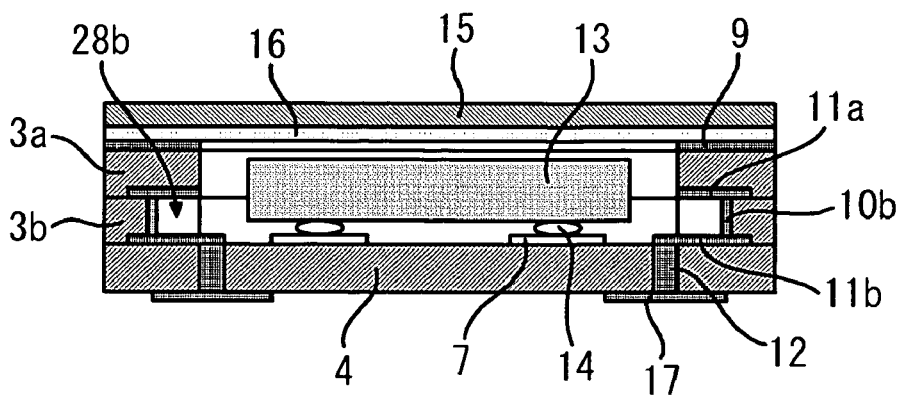
FIG. 8 is a cross-sectional view taken along a line E–E' shown in FIG. 6.
Figure 9:
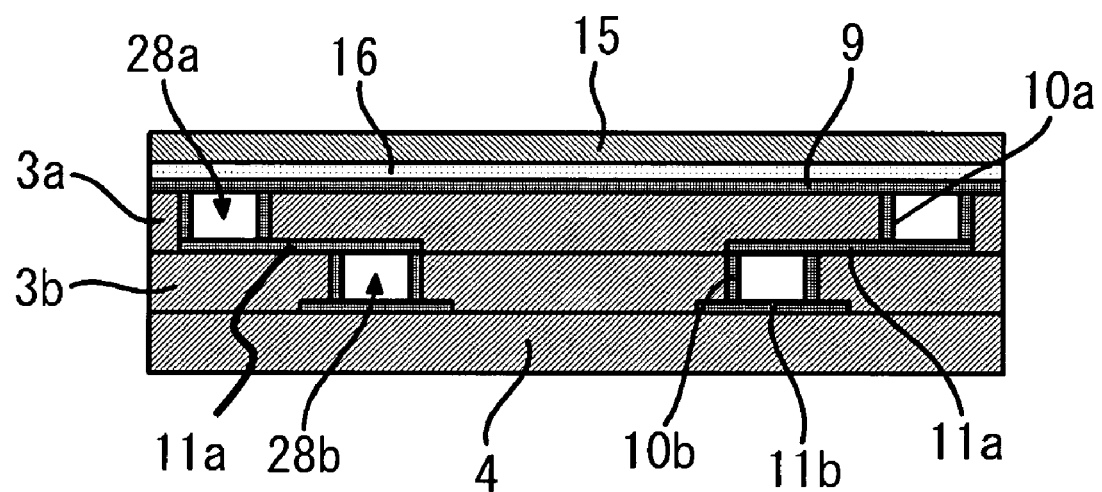
FIG. 9 is a cross-sectional view taken along a line F–F' shown in FIG. 6.

FIG. 7 is a cross-sectional view taken along a line D–D' shown in FIG. 6. FIG. 8 is a cross-sectional view taken along a line E—E shown in FIG. 6. FIG. 9 is a cross-sectional view taken along a line F—F shown in FIG. 6.

As shown in FIGS. 7 through 9, the upper substrate of the package 22 is made up of two layers, namely, a first upper-layer substrate 3a and a second upper-layer substrate 3b. The castellations 28a are formed on the first upper-layer substrate 3a on which the second upper-layer substrate 3b is provided. The castellations 28a are located at corners of the cavity 5. The castellations 28b are formed on the second upper-layer substrate 3b and are located at positions on the sidewalls of the cavity 5 so that the castellations 28a and 28b are arranged in zigzag form (not aligned).

The surfaces of the castellations 28a are plated, this resulting in plating layers 10a. The castellation plating layers 10a are electrically connected with the upper plating layer 9. The wiring pattern 11a is formed on the bottoms of the castellations 28a, namely, on the upper surface of the second upper-layer substrate 3b. The wiring pattern 11a is electrically connected with the castellation plating layers 10a, and is extended up to the upper portions of the castellations 28b.

The castellations 28b are also plated so that the castellation plating layers 10b are formed. The castellation plating layers 10b are, therefore, electrically connected with the castellation plating layers 10a via the wiring pattern 11a. A wiring pattern 11b is also formed on the bottoms of the castellations 28b, namely, the upper surface of the lower layer substrate 4. The wiring pattern 11b is electrically connected with the castellation plating layers 11b, and is also electrically connected with the grounded foot pattern 17 formed on the back surface of the package 22 via via-wiring lines 12 penetrating the lower layer substrate 4.

According to the above-mentioned configuration, the lid 15 fixed on the upper plating layer 9 with the washer 16 can be grounded. The other configurations of the SAW device 21 are the same as those of the first embodiment, and therefore, a description thereof will be omitted here.

The package 22 of the present embodiment can be fabricated by bonding substrates 400a, 300b and 300a (see FIGS. 10A through 10D), each of which may be a laminate of multiple substrates. A method of fabricating the package 22 will now be described with reference to FIGS. 10A through 10D.

Figure 10A:
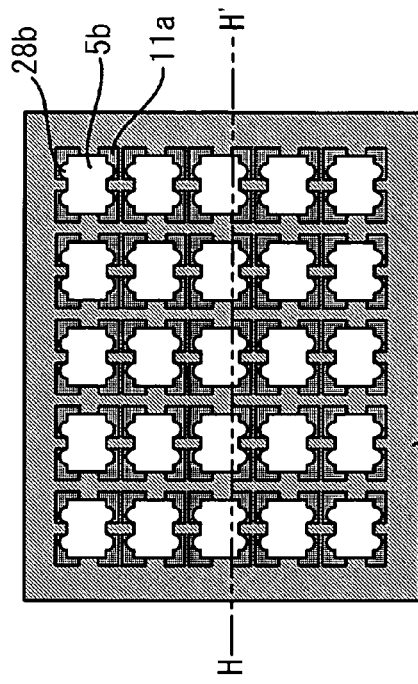

FIG. 10A is a plan view of the substrate 300a that has a multi-gathering structure in which multiple first upper-layer substrates 3a are integrally arranged in rows and columns. The substrate 300a has a plurality of cavities 5a that are arranged two-dimensionally. Each cavity 5a corresponds to an upper portion of the cavity 5, which is defined together with a cavity 5b as will be described later. The castellations 28a are formed at the four corners of each cavity 5a so as to connect the upper and lower surfaces of the first upper-layer substrate 3a. The surfaces of the castellations 28a are plated so as to form castellation plating layers 10a. A plating layer 9A having a given pattern is formed on the upper surface of the first upper-layer substrate 300a. This plating layer 9A corresponds to the upper plating layer 9 prior to dividing.

Figure 10B:
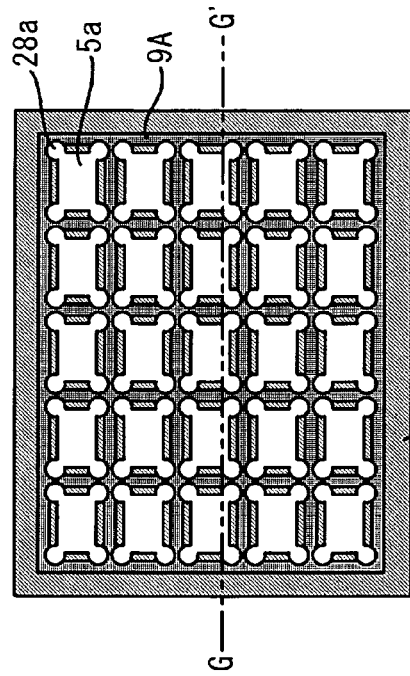

FIG. 10B is a plan view of the substrate 300b that has a multi-gathering structure in which multiple second upper-layer substrates 3b are integrally arranged in rows and columns. The substrate 300b has cavities 5b arranged at positions that correspond to those of the cavities 5a of the first upper-layer substrate 300a. The castellations 28b are formed on the inner walls of the cavities 5a at positions where the castellations 28b are not aligned with the castellations 28a formed on the cavities 5a. The surfaces of the castellations 28b are plated so that the castellation plating layers 10b are formed. Moreover, the wiring pattern 11a is formed on the upper surface of the substrate 300b to electrically connect the castellations 28a with the castellations 28b.

Figure 10C:
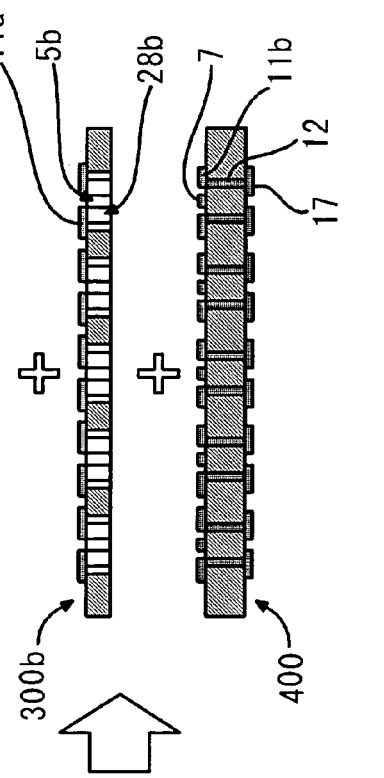

FIG. 10C is a plan view of a substrate 400 that has a multi-gathering structure in which multiple lower substrates 4 are integrally arranged in rows and columns. The die attach pattern 7 is formed in areas corresponding to the cavities 5a and 5b on the first and second upper layer substrates 3a and 3b. In other words, the die attach pattern 7 is provided on each area that is matured into the die attach surface 6 of the package 22. This arrangement of the die attach pattern 7 is the same as that shown in FIG. 4B. The wiring pattern 17 is formed in areas corresponding to the castellations 28b and areas in the vicinity thereof. The via-wiring lines 12 and the foot pattern 17 are formed on the lower layer substrate 4 (see FIG. 10D and FIG. 8).

Figure 10D:
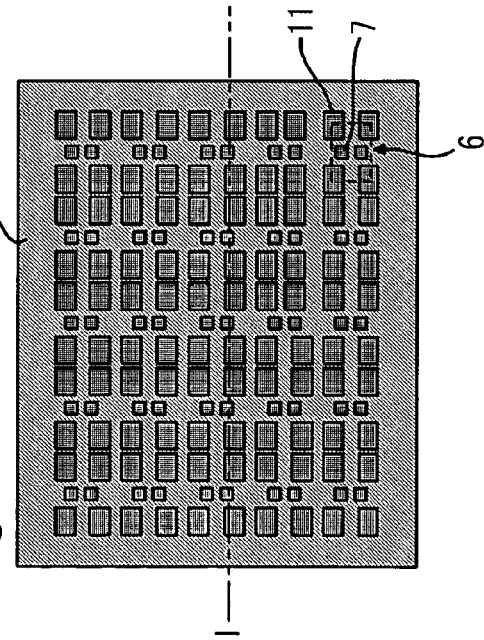

The packages 22 integrally arranged are fabricated by bonding the substrates 300a, 300b and 400 as shown in FIG. 10D. The individual SAW devices 21 with the packages 22 may be fabricated in the same manner as shown in FIGS. 5A through 5E.

The castellations 28a retains the washer portions 16a that are dissolved and flowed out during pressurizing and heating, and prevent the portions 16a from reaching the lower surface of the cavity 5 (die attach surface 6). Thus, the die attach pattern 7 formed on the bottom surface of the cavity 5 can be protected against short-circuiting.

Third Embodiment

Next, a third embodiment of the present invention will now be explained with reference to the accompanying drawings.

In the first and second embodiments, the castellations for retaining the flowed-out washer and preventing short-circuiting on the package backside or the cavity bottom are provided on the sidewalls of the package (more particularly, the inner and outer surfaces of the sidewalls). In contrast, the third embodiment employs holes in the sidewalls, which holes do not penetrate the sidewalls.

Figure 11:
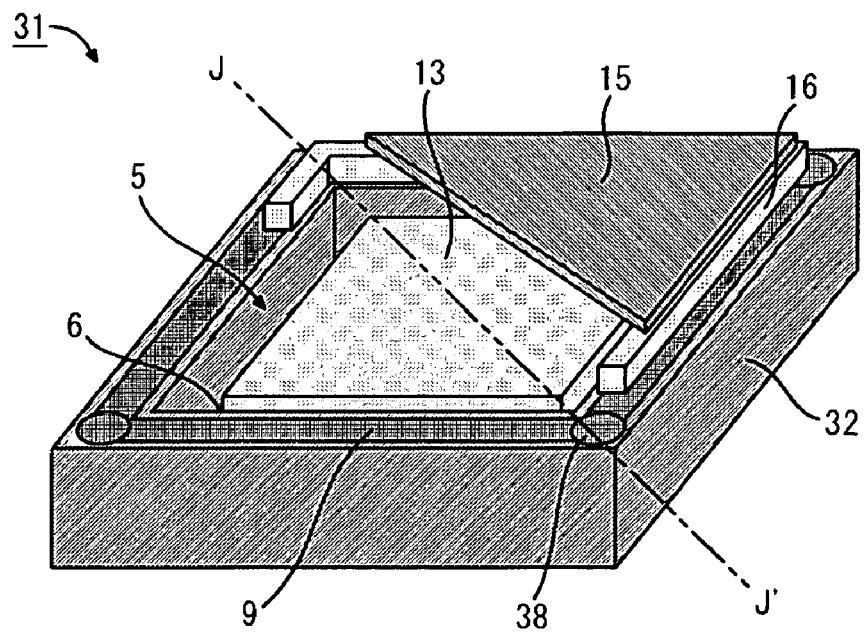
FIG. 11 is a perspective view of a SAW device according to a third embodiment of the present invention.

FIG. 11 is a perspective view of a SAW device 31 according to the third embodiment. As shown in FIG. 11, holes 38 are formed in sidewalls of a package 32 that define the cavity 5, more specifically, in the upper layer substrate 3 so as to penetrate the substrate 3. The inner surfaces of the holes 38 are plated. This configuration is explained in more detail with reference to FIG. 12.

Figure 12:
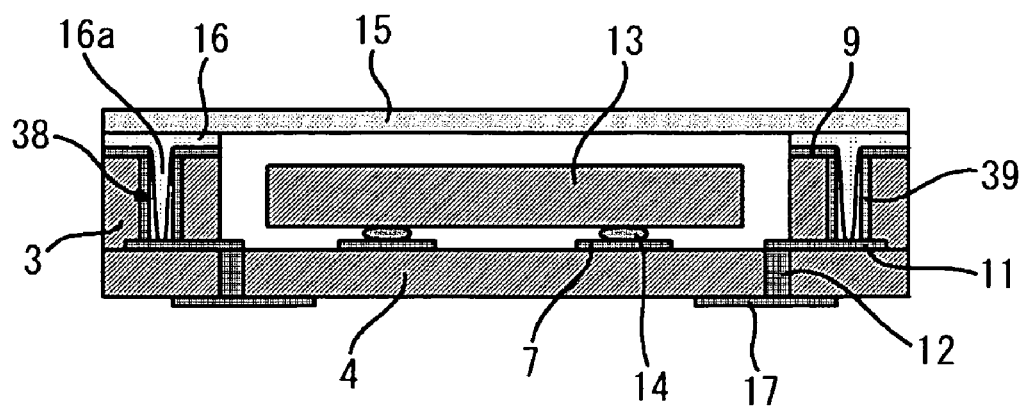
FIG. 12 is a cross-sectional view taken along a line J–J' shown in FIG. 11.

FIG. 12 is a cross-sectional view taken along a line J–J' shown in FIG. 11. As shown in FIG. 12, the holes 38 are formed so as to penetrate the upper layer substrate 3 from the upper surface thereof. The bottoms of the holes 38 are blocked by the lower layer substrate 4 (more specifically, by the wiring pattern 11 on the substrate 4).

The inner walls of the holes 38 are plated so that hole plating layers 39 are formed thereon. The hole plating layers 39 are electrically connected to the upper plating layer 9. The wiring pattern 11 is formed on the upper surface of the lower layer substrate 4 so as to block the holes 38. The wiring pattern 11 is electrically connected to the hole plating layers 39, and is also electrically connected to the grounded foot pattern 17 formed on the back surface of the package 22 through via-wiring lines 12 penetrating the lower layer substrate 4 as in the case of the first embodiment.

The above-mentioned structure makes it possible to set the lid 15 fixed to the upper plating 9 via the washer 16 at the ground potential. The other configurations of the third embodiment are same as those of the first embodiment, and therefore, a description thereof will be omitted here.

The package 32 of the present embodiment can be fabricated by the same fabrication process as that for the package 2 in the first embodiment. That is, the process bonds the lower layer substrate 4 and the upper layer substrate 3, each of which substrates is a laminate of thin layers.

A fabrication process of the SAW device 31 using the package 32 is the same as that of the SAW device 1, and therefore, a description thereof will be omitted here.

The above-mentioned configuration prevents the dissolved and flowed-out washer 16a from reaching the foot pattern 17 on the back surface of the package 32 and the lower surface of the cavity 5 (die attach surface 6) during the pressurization/heating process, since the washer 16a is retained in the holes 38. Thus, the holes 38 function to prevent short-circuiting on the foot pattern 17 and the die attach pattern.

Fourth Embodiment

Next, a fourth embodiment of the present invention will be explained with reference to the accompanying drawings.

The above-mentioned first and second embodiments employ the castellations on the inner or outer surfaces of the sidewalls that define the cavity. In contrast, the fourth embodiment employs a two-stage castellation structure, which corresponds to a variation of the two-stage castellation employed in the second embodiment. More particularly, the two-stage castellation structure of the fourth embodiment has castellations that extend from the opening of the cavity and that are provided on the outer surfaces of the sidewalls and are located at the four corners.

The castellations thus arranged at the corners of the sidewalls and provided on the outer surfaces thereof make it possible to avoid a situation in which the upper portion of the package is partially made thinner than the rest. This prevents a margin area for bonding the lid from being reduced due to the presence of the castellations.

Figure 13:
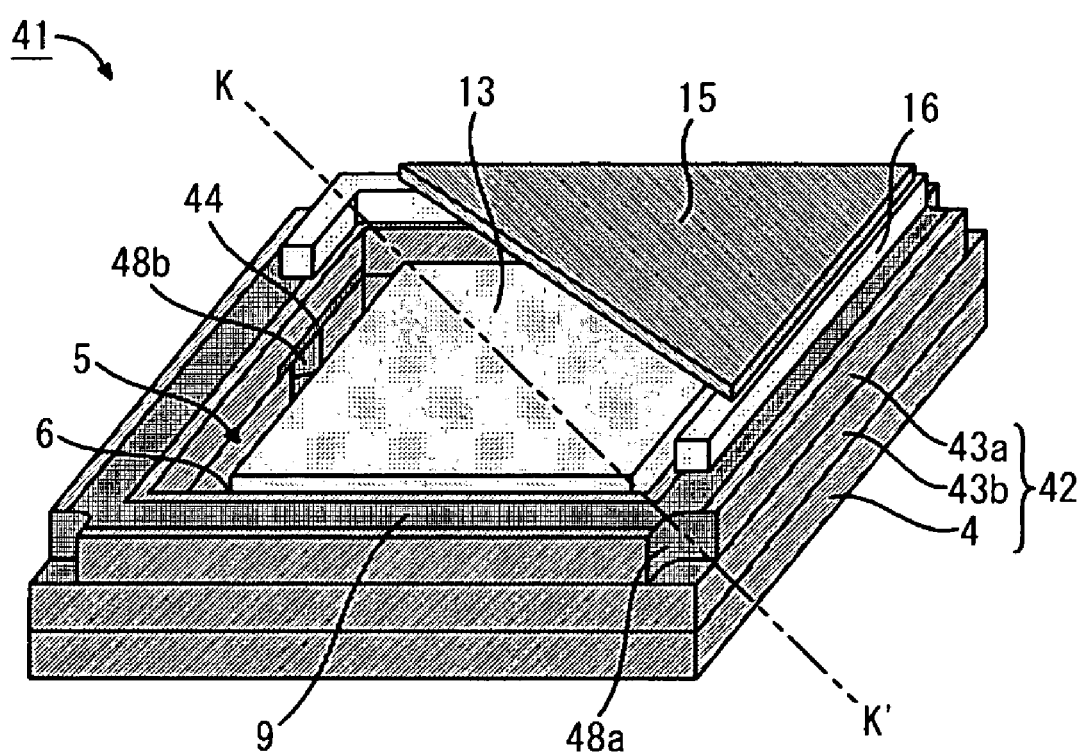
FIG. 13 is a perspective view of a SAW device according to a fourth embodiment of the present invention.

FIG. 13 is a perspective view of a SAW device 41 according to the fourth embodiment. As shown in FIG. 13, a package 42 is made up of a first upper-layer substrate 43a, a second upper-layer substrate 43b and a lower layer substrate 4 in which castellations 48a and 48b are formed so as to have a two-stage structure. The upper castellations 48a are located at the corners of the package 42, and the lower castellations 48b are formed on the inner walls of the cavity 5. However, the positions of the lower castellations 48b are not limited to the above. For instance, the castellations 48b may be formed anywhere on the inner surfaces of the sidewalls that define the cavity 5 so as not to reach the top of the opening. The castellations 48b may also be formed anywhere on the outer surfaces of the sidewalls so as not to reach the top of the opening.

Castellation plating layers 40a and 40b formed on the surfaces of the castellations 48a and 48b (see FIGS. 14A through 14C) are electrically connected to each other via a wiring pattern 44. This configuration will now be explained in more detail by referring to FIGS. 14A through 14C.

Figure 14A:
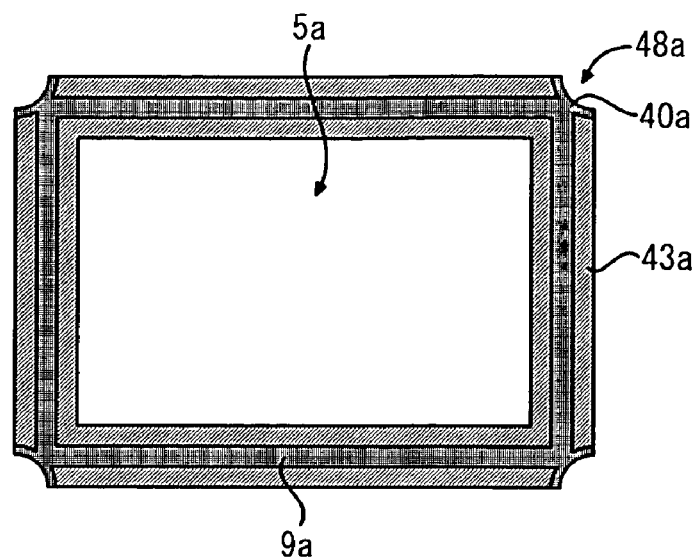
FIG. 14A is a plan view of a first upper substrate shown in FIG. 13.
Figure 14B:
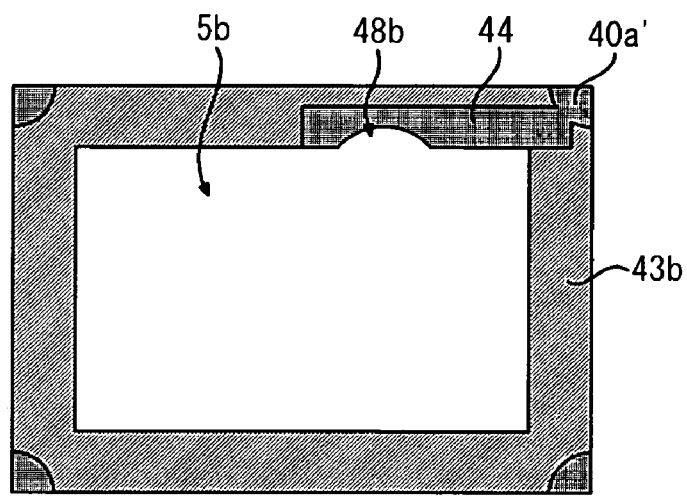
FIG. 14B is a plan view of a second upper substrate shown in FIG. 13.
Figure 14C:
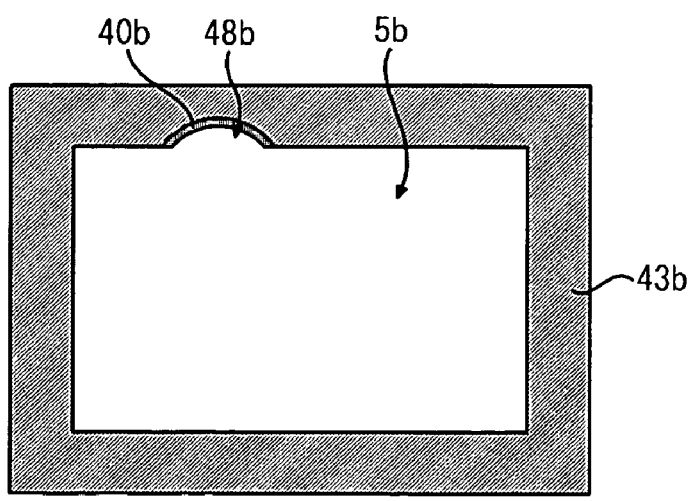
FIG. 14C is a bottom view of the second upper substrate shown in FIG. 13.

FIG. 14A is a plan view of the first upper-layer substrate 43a. FIG. 14B and FIG. 14C are respectively plan and bottom views of the second upper-layer substrate 43b.

As shown in FIG. 14A, the castellations 48a are formed at the corners of the first upper-layer substrate 43a, and are plated so that the castellation plating layers 40a are formed on the surfaces thereof. The castellation plating layers 40a are electrically connected to plating portions 40a' that are formed on the top of the second upper-layer substrate 43b. Moreover, at least one castellation 48b is formed on the inner wall of the second upper-layer substrate 43b, and is plated so that the castellation plating layer 40b is formed, as shown in FIGS. 14B and 14C. The castellation plating layers 40a and 40b are electrically connected to each other via the wiring pattern 44 shown in FIG. 14B.

Figure 15:
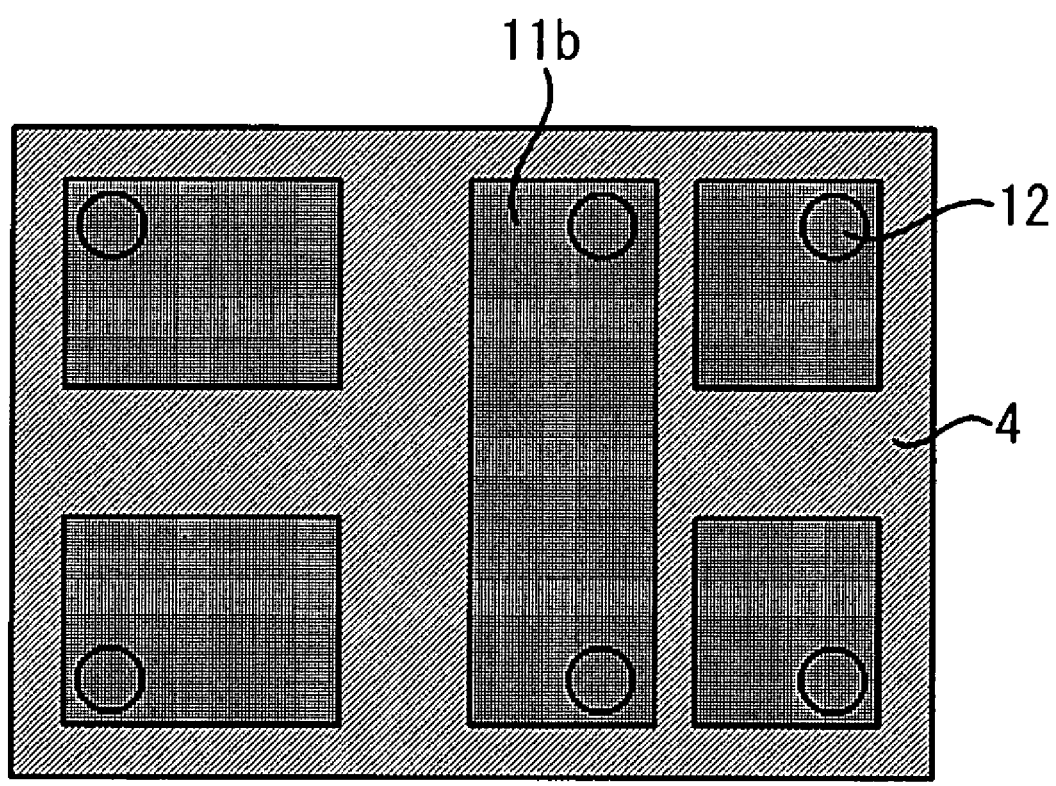
FIG. 15 is a plan view of a lower substrate used in the embodiments of the present invention.

The castellation plating layer 40b formed on the second upper-layer substrate 43b is electrically connected to the wiring pattern 11b on the lower substrate 4, as shown in FIG. 15, and is electrically connected to the grounded foot pattern 17 formed on the back surface of the package 42 through the via-wiring lines 12 penetrating the lower layer substrate 4.

With the above-mentioned structure, the lid 15 fixed on the upper plating layer 9a by the washer 16 can be grounded. The other configurations of the fourth embodiment are the same as those of the first embodiment, and therefore, a description thereof will be omitted here. The methods of fabricating the package 2 and the SAW device 41 are the same as those in the above-mentioned embodiments (especially the second embodiment), and therefore, a detail explanation thereof will be omitted here.

With the above-mentioned structure, it is possible to prevent the upper portions of the sidewalls from being partially made thin and to increase the margin for bonding the lid 15. This contributes to simplifying the fabrication process. Of course, the present embodiment brings about the same effects as those provided by the other embodiments.

Other Embodiment

The present invention is not limited to the specifically described embodiments, and other embodiments and variations may be made without departing from the scope of the present invention. For example, the lid 15 and the washer 16 are not limited to conductive materials but may be made of another material such as resin that allows the lid to hermetically seal the cavity with a softened washer.

The present invention is based on Japanese Patent Application Nos. 2003-064227 and 2003-121562 filed on Mar. 10, 2003 and Apr. 25, 2003, respectively, and the entire disclosure of which is hereby incorporated by reference.

What is claimed is:

1. A package for an electronic device comprising:
a cavity that houses an electronic element; and
grooves or holes formed on or in sidewalls that define the cavity,
the grooves or holes extending from an open side of the cavity so as not to reach a bottom side of the package, further comprising:
a first conductive layer formed so as to surround an opening of the package;
second conductive layers formed on surfaces of the grooves or holes and connected to the first conductive layer; and
a wiring pattern that grounds the second conductive layers.

2. The package as claimed in claim 1, wherein the grooves are formed on outer surfaces of the sidewalls.

3. The package as claimed in claim 1, wherein the grooves are formed on inner surfaces of the sidewalls and extend so as not to reach a bottom of the cavity.

4. A package for an electronic device comprising:
a cavity that houses an electronic element; and
first and second grooves formed on inner surfaces of sidewalls that define the cavity, wherein:
the first grooves extend from an open side of the cavity so as not to reach a bottom side of the package;
the second grooves extend from a bottom of the cavity so as not to reach the open side of the cavity; and
the first and second grooves are arranged in zigzag form.

5. The package as claimed in claim 4, further comprising:
a first conductive layer formed so as to surround an opening of the cavity;
second conductive layers formed on surfaces of the first grooves and connected to the first conductive layer;
third conductive layers formed on surfaces of the second grooves;
a first wiring pattern connecting the second and third conductive layers; and
a second wiring pattern that grounds the third conductive layers.

6. A package for an electronic device comprising:
a cavity that houses an electronic element; and
grooves or holes formed on or in sidewalls that define the cavity, wherein:
the grooves include first grooves formed on inner surfaces of the sidewalls and are positioned at corners of the package, and second grooves formed on inner or outer surfaces of the sidewalls;
the first grooves extend from an open side of the cavity so as not to reach a bottom side of the package;
the second grooves extend from a bottom of the cavity or the bottom of the package so as not to reach the open side of the cavity; and
the first and second grooves are arranged in zigzag form.

7. The package as claimed in claim 6, further comprising:
a first conductive layer formed so as to surround an opening of the cavity;
second conductive layers formed on surfaces of the first grooves and connected to the first conductive layer;
third conductive layers formed on surfaces of the second grooves;
a first wiring pattern connecting the second and third conductive layers; and
a second wiring pattern that grounds the third conductive layers.

8. An electronic device comprising:
an electronic element;
a package that houses the electronic element; and
a lid attached to the package,
the package comprising:
a cavity that houses the electronic element;
grooves or holes formed on or in sidewalls that define the cavity, the grooves or holes extending from an open side of the cavity so as not to reach a bottom side of the package;
a first conductive layer formed so as to surround an opening of the package;
second conductive layers formed on surfaces of the grooves or holes and connected to the first conductive layer; and
a wiring pattern that grounds the second conductive layers.

9. An electronic device comprising:
an electronic element;
a package that houses the electronic element; and
a lid attached to the package,
the package comprising:
a cavity that houses the electronic element; and
grooves or holes formed on or in sidewalls that define the cavity, the grooves or holes extending from an open side of the cavity so as not to reach a bottom side of the package, wherein:
the grooves include first and second grooves that are formed on inner surfaces of the sidewalls;
the first grooves extend from the open side of the cavity so as not to reach the bottom of the package;
the second grooves extend from a bottom of the cavity so as not to reach the open side of the cavity; and
the first and second grooves are arranged in zigzag form.

10. The electronic device as claimed in claim 9, wherein the grooves are formed on inner surfaces of the sidewalls and extend so as not to reach a bottom of the cavity.

11. The electronic device as claimed in claim 9, further comprising:
a first conductive layer formed so as to surround an opening of the cavity;
second conductive layers formed on surfaces of the first grooves and connected to the first conductive layer;
third conductive layers formed on surfaces of the second grooves;
a first wiring pattern connecting the second and third conductive layers; and
a second wiring pattern that grounds the third conductive layers.

12. An electronic device comprising:
an electronic element;
a package that houses the electronic element; and
a lid attached to the package,
the package comprising:
a cavity that houses the electronic element; and
grooves or holes formed on or in sidewalls that define the cavity, the grooves or holes extending from an open side of the cavity so as not to reach a bottom side of the package, wherein:
the grooves include first grooves formed on inner surfaces of the sidewalls and are positioned at corners of the package, and second grooves formed on inner or outer surfaces of the sidewalls;
the first grooves extend from the open side of the cavity so as not to reach the bottom of the package;
the second grooves extend from a bottom of the cavity or the bottom of the package so as not to reach the open side of the cavity; and
the first and second grooves are arranged in zigzag form.

13. The electronic device as claimed in claim 12, further comprising:
a first conductive layer formed so as to surround an opening of the cavity;
second conductive layers formed on surfaces of the first grooves and connected to the first conductive layer;
third conductive layers formed on surfaces of the second grooves;
a first wiring pattern connecting the second and third conductive layers; and
a second wiring pattern that grounds the third conductive layers.

* * * * *